US012706385B2

(12) United States Patent
Boudreau et al.

(10) Patent No.: US 12,706,385 B2
(45) Date of Patent: Aug. 11, 2026

(54) DUAL-BAND RADIATING ELEMENT AND MODULAR ANTENNA ARRAY

(71) Applicant: MacDonald, Dettwiler and Associates Corporation, Sainte-Anne-de-Bellevue (CA)

(72) Inventors: Nicholas Boudreau, Sainte-Anne-de-Bellevue (CA); Aiping Liang, Sainte-Anne-de-Bellevue (CA); Mathieu Riel, Sainte-Anne-de-Bellevue (CA)

(73) Assignee: MacDonald, Dettwiler and Associates Corporation, Sainte-Anne-de-Bellevue (CA)

( * ) Notice: Subject to any disclaimer, the term of this patent is extended or adjusted under 35 U.S.C. 154(b) by 88 days.

(21) Appl. No.: 18/253,056

(22) PCT Filed: Nov. 24, 2021

(86) PCT No.: PCT/CA2021/051678
§ 371 (c)(1),
(2) Date: May 16, 2023

(87) PCT Pub. No.: WO2022/109734
PCT Pub. Date: Jun. 2, 2022

(65) Prior Publication Data

US 2024/0021995 A1 Jan. 18, 2024

Related U.S. Application Data

(60) Provisional application No. 63/117,972, filed on Nov. 24, 2020.

(51) Int. Cl.
*H01Q 9/04* (2006.01)
*H01Q 1/28* (2006.01)
(Continued)

(52) U.S. Cl.
CPC ........... *H01Q 9/0414* (2013.01); *H01Q 1/288* (2013.01); *H01Q 1/50* (2013.01); *H01Q 1/521* (2013.01);
(Continued)

(58) Field of Classification Search
CPC ........ H01Q 9/0414; H01Q 1/288; H01Q 1/50; H01Q 1/521; H01Q 9/045
See application file for complete search history.

(56) References Cited

U.S. PATENT DOCUMENTS 9,116,239 B1 * 8/2015 Billsberry ................ H01Q 1/28
2012/0068906 A1 3/2012 Asher et al.
(Continued)

FOREIGN PATENT DOCUMENTS

CN 101662074 A 3/2010
CN 203300803 U * 11/2013
(Continued)

OTHER PUBLICATIONS

International Search Report and Written Opinion issued in respect of corresponding PCT International Patent Application No. PCT/CA2021/051678 and issued on Mar. 2, 2022.
(Continued)

*Primary Examiner* — Dieu Hien T Duong
(74) *Attorney, Agent, or Firm* — Own Innovation; James W. Hinton; Kent C. Howe

(57) ABSTRACT

A dual band radiating element and modular antenna array suitable for application in space communications is provided. The dual band radiating element comprises a stacked patch antenna for transmitting RF signal of a first signal frequency band (e.g. S-Band) and receiving RF signals of a second signal frequency band (e.g. L-Band). The concentric design of the radiating element can achieve savings in material and mass compared to other stacked patch antennas.
(Continued)

For effective operation in space applications, a first radiation patch in the radiating element is isolated from a second radiation patch by shielding a feed pin to the first radiation patch as it travels through the dielectric layer separating the patches. Individual radiating elements can be attached to individual filter/amplification units in a modular antenna array allowing for individual components to be easily installed, repaired or replaced with minimal impact to the rest of the antenna array and/or spacecraft.

11 Claims, 13 Drawing Sheets

(51) Int. Cl.

*H01Q 1/50* (2006.01)
*H01Q 1/52* (2006.01)
*H01Q 21/00* (2006.01)
*H01Q 23/00* (2006.01)
*H05K 7/20* (2006.01)

(52) U.S. Cl.

CPC ......... *H01Q 9/045* (2013.01); *H01Q 21/0025* (2013.01); *H01Q 23/00* (2013.01); *H05K 7/20336* (2013.01)

(56) References Cited

U.S. PATENT DOCUMENTS

2016/0261047 A1 9/2016 Wallace et al.
2020/0358203 A1 11/2020 Park et al.
2021/0036428 A1 * 2/2021 Ueda ..................... H01Q 13/08

FOREIGN PATENT DOCUMENTS

CN 109039420 B 12/2018
CN 208272132 U * 12/2018
EP 0521384 A1 1/1993
JP H08213835 A * 8/1996
JP 2010226633 A * 10/2010
KR 101014352 B1 2/2011
WO 2010009685 A1 1/2010

OTHER PUBLICATIONS

European Patent Office, Partial Supplementary European Search Report, Communication pursuant to Rule 164(1) EPC issued in respect of European Patent Application No. 21896004.5, Sep. 10, 2024.
Non-Final Office Action issued on Korean Patent Application No. 2023-7020670 on Jul. 1, 2025.

* cited by examiner

702

DUAL-BAND RADIATING ELEMENT AND MODULAR ANTENNA ARRAY

TECHNICAL FIELD

The following relates generally to antennas, antenna assemblies and arrays for radio frequency (RF) communication, and more particularly to a dual band radiating element and modular radiating array suitable for space communication applications.

INTRODUCTION

Active radiating arrays for space communication are typically single band with one or two polarizations requiring the use of multiple arrays for uplink and downlink. This in turn creates problems of thermal management, weight and space requirement for the placement of multiple single band arrays onboard spacecraft (e.g. satellites). A further challenge in using dual band stacked patch antennas is that the isolation of the receive band from the transmit band is not sufficient for proper operation in space communication applications.

Accordingly, there is a need for an improved dual band radiating array for space communications applications that overcomes at least some of the disadvantages of existing systems and methods. Further, there is a need for modular components that can be easily installed, repaired or replaced with minimal impact to the rest of the antenna array and/or spacecraft.

SUMMARY

According to one aspect, there is a dual band radiating element. The radiating element comprises a first radiating patch antenna for transmitting RF signal of a first signal frequency band (e.g. S-Band), and a second radiating patch antenna for receiving RF signals of a second signal frequency band (e.g. L-Band) using one polarization. A first dielectric layer interposes the first radiating patch and the second radiating patch and a second dielectric layer interposes the second radiating patch and a ground plane.

The radiating element further comprises a base plate, comprising a top surface adjacent to the ground plane, a first connector and a second connector disposed on a bottom surface, a first feed pin for relaying radio frequency signals from the first connector to the second radiating patch via a first port in the second dielectric layer and a second feed pin for relaying radio frequency signals from the second connector to the first radiation patch via a second port in the second dielectric layer.

The top surface of the base plate and the ground plane enclose a feed network for routing the first feed pin and the second feed pin to the first port and the second port, respectively, wherein the second pin is shielded by the second port as the second pin passes through the second dielectric layer, to isolate the first radiating patch from the second radiating patch. According to an embodiment, the feed network may comprise a third dielectric layer and a fourth dielectric layer.

The radiating element have a concentric design wherein the first radiating patch, the first dielectric layer, the second radiating patch and the second dielectric layer form concentric layers. According to an embodiment, the first radiating patch is centered on the second radiating patch and covers about 50% of the surface area of second radiating patch.

According to another aspect, there is a method for modular assembly of a dual band radiating array for space communications. The method comprises: removably attaching a plurality of combined units to a satellite bus in a grid arrangement; and removably attaching a dual band radiating element to each combined unit.

Each combined unit comprises: a bottom having at least one attachment point for removably attaching the combined unit to the satellite bus using at least one first mechanical fastener; and a top having at least one mounting point, a transmit signal interface and a receive signal interface.

Each dual band radiating element comprises: a first connector and a second connector disposed on a bottom surface of the radiating element and at least one aperture for receiving an at least one second mechanical fastener. A radiating element is removably attached to each combined unit at the one mounting point using at least one second mechanical fastener. Upon attachment of the dual band radiating element to the combined unit the first connector contacts the transmit signal interface and the second connector contacts the receive signal interface.

According to an embodiment, each combined unit further comprises a filter module comprising a first band filter connected to the transmit signal interface and a second band filter connected to the receive signal interface.

According to an embodiment, each combined unit further comprises: a signal amplification module comprising a transmit signal amplification unit connected to the first band filter and a receive signal amplification unit connected to the second band filter. According to an embodiment, the transmit signal amplification unit is a solid-state power amplifier. According to an embodiment, the receive signal amplification unit is a low noise amplifier.

Other aspects and features will become apparent, to those ordinarily skilled in the art, upon review of the following description of some exemplary embodiments.

BRIEF DESCRIPTION OF THE DRAWINGS

The drawings included herewith are for illustrating various examples of articles, methods, and apparatuses of the present specification. In the drawings.

DETAILED DESCRIPTION

Various apparatuses or processes will be described below to provide an example of each claimed embodiment. No embodiment described below limits any claimed embodiment and any claimed embodiment may cover processes or apparatuses that differ from those described below. The claimed embodiments are not limited to apparatuses or processes having all of the features of any one apparatus or process described below or to features common to multiple or all of the apparatuses described below.

Figure 1:
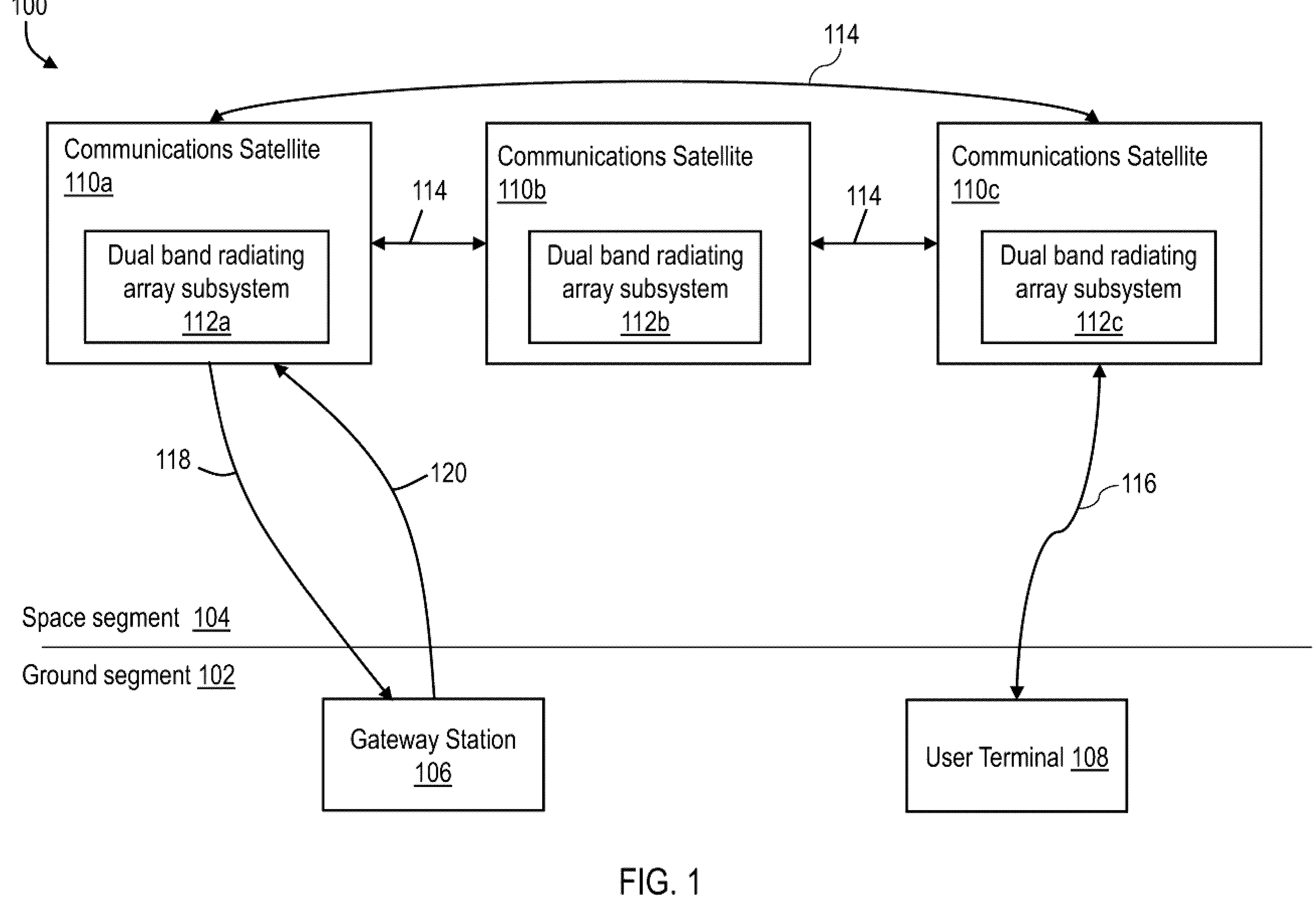
FIG. 1 is a block diagram of a satellite communication system including a plurality of satellites each having a dual-band radiating array antenna subsystem, according to an embodiment.

Referring now to FIG. 1, shown therein is a system 100 for satellite-based communication, according to an embodiment.

The system 100 includes a ground segment 102 and a space segment 104.

The space segment 104 of system 100 includes communications satellites 110*a*, 110*b*, and 110*c*. Communications satellites 110*a*, 110*b*, 110*c* are referred to herein collectively as communication satellites 110 and generically as communication satellite 110.

It is to be understood that the system 100 may include any number of communication satellites 110 (i.e. one or more). In a particular embodiment, the satellite 110 is a low-earth orbit (LEO) satellite. According to other embodiments, the system 100 may be implemented in orbits other than LEO (e.g. Geostationary Orbit, Medium Earth Orbit). In embodiments of the system 100 including a plurality of satellites 110, the satellites 110 may be referred to collectively as a satellite constellation or satellite network.

The communications satellites 110*a*, 110*b*, 110*c* each include a dual band radiating array subsystem (array subsystems 112*a*, 112*b*, 112*c*, respectively). Dual band radiating array subsystems 112*a*, 112*b*, 112*c* are referred to herein collectively as dual band radiating array subsystems 112 and generically as dual band radiating array subsystem 112.

The dual band radiating array subsystem 112 is configured to perform RF transmission in a first predetermined signal frequency band and RF reception in a second predetermined signal frequency band, wherein the first and second signal frequency bands do not overlap. The term "dual band" as used herein (such as to refer to the radiating array itself or to a radiating element thereof) thus refers to the ability of the radiating array antenna to transmit RF signals in a first predetermined signal frequency band ("transmit band") and receive RF signals in a second, different predetermined signal frequency band ("receive band"). The first and second signal frequency bands may correspond to designated satellite frequency bands. For example, in a particular embodiment, the array subsystem 112 may transmit RF signals in the S-band (approx. 2-4 GHz) and receive RF signals in the L-band (approx. 1-2 GHz). In another embodiment, the array subsystem 112 may receive RF signals in the S-band and transmit RF signals in the L-band. According to other embodiments, the array subsystem 112 may be scaled to transmit/receive at other frequencies provided the S/L frequency ratio is respected. In variations, the array subsystem 112 may be configured for use at frequencies lower than Ka-band. For example, the array subsystem 112 may be configured for user at C-band frequency or Ku-band frequency.

The dual band radiating array subsystem 112 includes a dual band radiating array antenna. The dual band radiating array antenna may be an active array (e.g. containing DC powered circuit, amplifiers, beamforming circuits, etc.). The dual band radiating array antenna is configured to perform digital beamforming.

Communications satellites 110*a*, 110*b*, and 110*c* communicate with one another via inter-satellite communication links 114.

The ground segment 102 includes a gateway earth station ("GES") 106 (or gateway station 106). The system 100 may include a plurality of gateway stations 106, which may be positioned at different locations.

Transmission of RF signals in a first frequency band from the gateway station 106 ("uplink") and reception of RF signals in a second frequency band at the gateway station 106 ("downlink") may be performed by different gateway stations 106 configured to operate in their respective signal frequency bands.

The gateway station 106 may be located on the surface of the Earth, in the atmosphere, or in space. The gateway station 106 may be fixed or mobile.

The gateway station 106, which may be surface-based or atmosphere-based, includes one or more devices configured to provide real-time communication with satellites 110.

The communications satellites 110 communicate with the gateway station 106 via communication downlink 118 and communication uplink 120. In FIG. 1, only communications satellite 110*a* is shown with communication links 118, 120, but it is to be understood that communications satellites 110*b*, 110*c* form similar communication links with the gateway station 106.

The gateway station 106 is configured to establish a telecommunications link 118, 120 with a satellite 110 when the satellite 110 is in "view" of the gateway station 106. The gateway station 106 transmits and/or receives radio ("RF") waves to and/or from the satellite 110. The gateway station 106 may include a parabolic antenna for transmitting and receiving the RF signals. The gateway station 106 may have a fixed or itinerant position.

The gateway station 106 sends radio signals to the satellite 110 (uplink) via communication link 120 and receives data transmissions from the satellite (downlink) via the communication link 118.

The gateway station 106 may serve as a command and control center for a satellite network (or "satellite constellation").

The gateway station 106 may analyze data received from the satellites 110 and/or may relay the received data to another location (i.e. another computer system, such as another gateway station 106) for analysis. In some cases, the gateway station 106 may receive data from the satellite 110 and transmit the received data to a computing device specially configured to perform processing and analysis on the received satellite data.

The gateway station 106 may further be configured to receive data from the satellite 110 and monitor navigation or positioning of the satellite 110 (e.g. altitude, movement) or monitor functioning of the satellite's critical systems (e.g. by analyzing data from the critical system being monitored).

The gateway station 106 may include any one or more of the following elements: a system clock, antenna system, transmitting and receiving RF equipment, telemetry, tracking and command (TT&C) equipment, data-user interface, mission data recovery, and station control center.

The ground segment 102 of system 100 also includes a user terminal 108.

The user terminal 108 may be a fixed or mobile terminal. The user terminal 108 may be any device capable of transmitting and/or receiving RF communication signals. The user terminal 108 includes an RF communication module for transmitting and/or receiving the RF signals. The user terminal 108 may be, for example, a computing device, such as a laptop or desktop, or a mobile device (e.g. smartphone).

The communications satellite 110*c* communicates with the user terminal 108 via communications link 116. Communications performed by satellite 110*c* via communications link 116 may include transmission and reception. While FIG. 1 shows communication link 116 established between the satellite 110*c* and the user terminal 108, it is to be understood that the user terminal 108 may establish a similar communication link with satellite 110*a* or 110*b*. Similarly, the communications satellite 110*c* may establish similar communication links with other user terminals.

Figure 2:
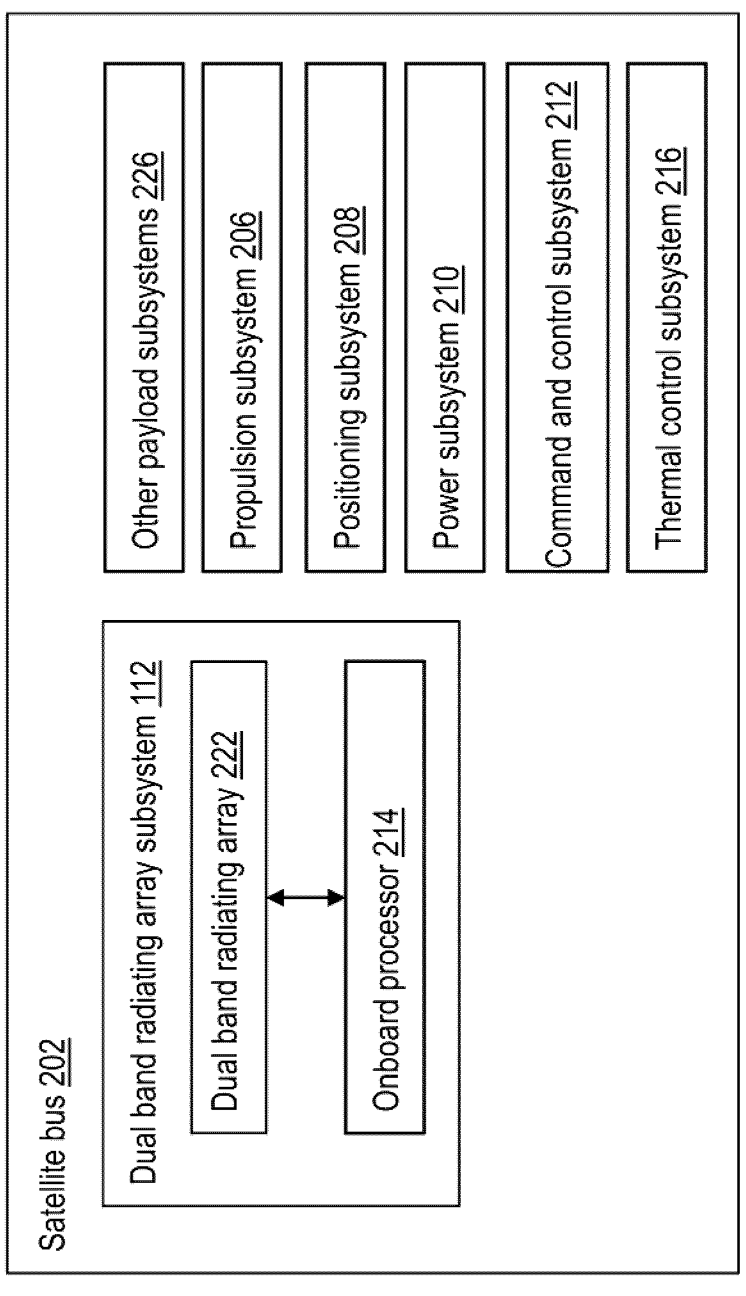
FIG. 2 is a block diagram of a communications satellite of FIG. 1, according to an embodiment.

Referring now to FIG. 2, shown therein is a communications satellite 110 of FIG. 1, according to an embodiment.

The communications satellite 110 includes a satellite bus 202. The satellite bus 202 provides the body of the satellite 110. The satellite bus 202 provides structural support and an infrastructure of the satellite 110 as well as locations for a payload (e.g. various subsystems, such as the DRA subsystem 112). Components of the communications satellite 110 may be housed within an interior of the satellite bus 202 or may be connected to an external surface of the satellite bus 202 (directly or indirectly through another component).

The communications satellite 110 includes a propulsion subsystem 206 for driving the communications satellite 110. The propulsion subsystem 206 adjusts the orbit of the satellite 110. The propulsion subsystem 206 includes one or more actuators, such as reaction wheels or thrusters. The propulsion subsystem 206 may include one or more engines to produce thrust.

The communications satellite 110 includes a positioning subsystem 208. The positioning subsystem 208 uses specialized sensors to acquire sensor data (e.g. measuring orientation) which can be used by a processing unit of the positioning subsystem 208 to determine a position of the satellite 110. The positioning subsystem 208 controls attitude and orbit of the satellite 110. The positioning subsystem 208 communicates with the propulsion subsystem 208.

Together, the positioning subsystem 208 and the propulsion subsystem 206 determine and apply the torques and forces needed to re-orient the satellite 110 to a desired attitude, keep the satellite 110 in the correct orbital position, and keep antennas (e.g. the dual band radiating array 222) pointed in the correct direction.

The communications satellite 110 includes an electrical power subsystem 210. The electrical power subsystem 210 provides power for the dual band array subsystem 112, as well as for other components. The power may be provided through the use of solar panels on the satellite bus 202 that convert solar radiation into electrical current. The power subsystem 210 may also include batteries for storing energy to be used when the satellite 110 is in Earth's shadow.

The communications satellite 110 includes a command and control subsystem 212. The command and control subsystem 212 includes electronics for controlling how data is communicated between components of the communications satellite 110. The propulsion subsystem 206, the positioning subsystem 208, and the power subsystem 210 may each be communicatively connected to the command and control subsystem 212 for transmitting data to and receiving data from the command and control subsystem 212.

The communications satellite 110 also includes a thermal control subsystem (or thermal management subsystem) 216. The thermal control subsystem 216 controls, manages, and regulates the temperature of one or more components of the communications satellite 110, such as signal amplification units of the radiating module, within acceptable temperature ranges, which may include maintaining similar components at a generally uniform temperature. For example, the thermal control subsystem 216 may manage the temperature of components the subsystem 112 by managing heat generated by active heat sources (heat generating components) thereof. Generally, the thermal control subsystem 216 protects electronic equipment of the dual band array subsystem 112 from extreme temperatures due to self-heating of the dual band array subsystem 112 (i.e. by operation of the signal amplification components of the dual band array subsystem). The thermal control subsystem 216 may include active components or passive components.

The communications satellite 110 may also include other payload subsystems 226. The other payload subsystems 226 may include any one or more of optical intersatellite terminals, gateway antennas, filters, cables, waveguides, etc.

The communications satellite 110 includes a dual band array subsystem 112. The dual band array subsystem 112 includes a dual band radiating array 222 and an onboard processor ("OBP") 214. The dual band radiating array 222 is communicatively connected to the OBP 214. The OBP 214 may be part of the satellite's payload.

The OBP 214 performs the digital beamforming (Rx and Tx digital beamforming) and channelization. On the forward link, the signal received is digitized, the channels are demultiplexed and sent to the processor for beamforming, conversion to analog and distribution to the transmit antenna elements. On the return link, the signals received from the receive antenna elements are digitized, subchannels are demultiplexed and beams are formed by the processor. The obtained beam signals are multiplexed, converted to analog and sent to the downlink.

The digital beamforming operations performed by the OBP 214 allow for the array of dual band RF radiating elements to be steered to transmit RF signals in a specific direction and minimize radiated power in other directions (the antenna can null certain directions to prevent interference). Each radiating element in the array may be fed separately with the signal to be transmitted. The phase, and possibly the amplitude, of each signal is then added constructively and destructively in such a way that the energy is concentrated into a narrow beam or lobe and minimized in other directions. Controlling the amplitude may be optional in some designs.

The dual band array 222 is both a receive (Rx) antenna and a transmit (Tx) antenna. In variations, the communications satellite 110 may have a plurality of dual band array assemblies 222 or dual band array subsystems 112. The number of dual band array subsystems 112 or dual band array assemblies on the communications satellite 110 is not particularly limited.

The dual band array 222 transmits an electromagnetic RF signal within a first predetermined signal frequency band and receives an electromagnetic RF signal within a second predetermined signal frequency band. The dual band array assembly may be configured to use a subset of the overall signal frequency band.

Figure 3:
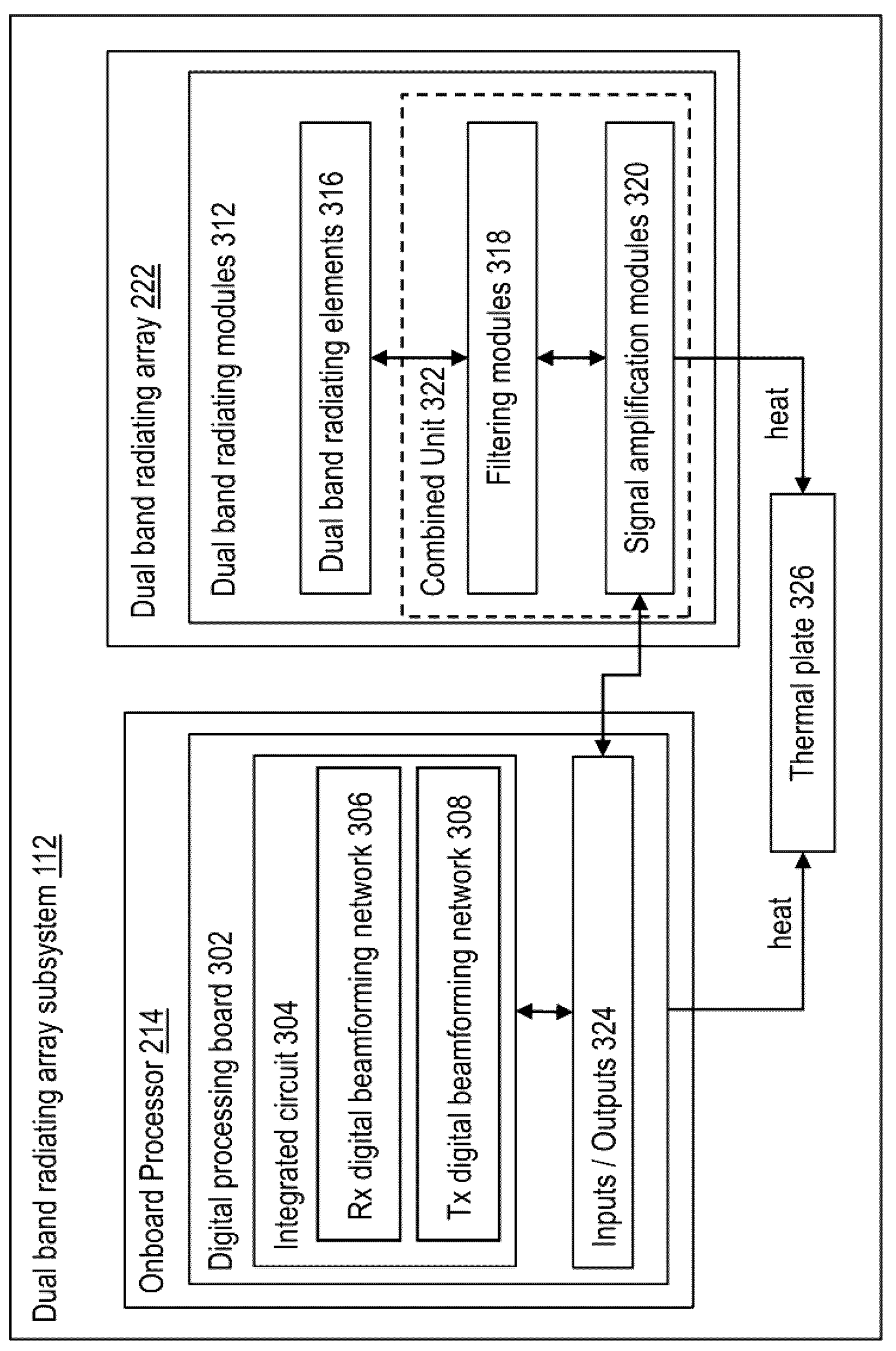
FIG. 3 is a block diagram of the dual band radiating array subsystem of FIG. 2, according to an embodiment.

Referring now to FIG. 3, shown therein are the dual band array 222 and OBP 214 of FIG. 2 in greater detail, according to an embodiment.

Generally, the dual band radiating array 222 is a phased array antenna including a collection of antenna or radiating elements 316 assembled together such that the radiation pattern of each individual radiating element 316 constructively combines with neighboring radiating elements 316 to form an effective radiation pattern called a main lobe. The main lobe transmits radiated energy in a desired location while the dual band array is designed to destructively interfere with signals in undesired directions, forming nulls and side lobes. The dual band array subsystem 112 may be designed to maximize the energy radiated in the main lobe while reducing energy radiated in the side lobes to an acceptable level. The direction of radiation may be manipulated by changing the phase of the signal fed into each radiating element 316. The result is that each radiating element 316 in the array 222 has an independent phase and amplitude setting to form a desired radiation pattern.

The radiating element 316 includes an input connection and output connection for receiving signals from and transmitting signals to the filtering module 318, respectively.

The filtering module 318 includes input and output connections for receiving signals from and transmitting signals to the radiating element 316. The filtering module 318 also includes input and output connections for receiving signals from and transmitting signals to the signal amplification module 320. According to some embodiments, the filtering module 318 and signal amplification module 320 may be housed together in a combined unit 322.

The signal amplification module 320 includes input and output connections for receiving filtered signals from and transmitting signals (to be filtered) to the filtering module 318. The signal amplification module 320 routes filtered signals received from the filtering module 318 to the Rx amplification unit for amplification. The signal amplification module 320 routes amplified Tx signals from the Tx amplification unit to the filtering module 318.

The signal amplification module 320 also includes input and output connections for receiving signals (for amplification) from and transmitting amplified signals to the digital processing board (described further below) to which the radiating module 312 is connected. The signal amplification module 320 is thus configured to route signals received from the digital processing board to the Tx amplification unit for signal amplification and to route amplified Rx signals from the Rx amplification unit to the digital processing board.

The OBP 214 includes one or more digital processing boards 302. FIG. 3 illustrates a representative digital processing board 302 but it is to be understood that in variations of the dual band array subsystem 112, the OBP 214 includes a plurality of digital processing boards 302 and the number of digital processing boards 302 is not particularly limited. In an embodiment with one digital processing board 302, each of the radiating elements 316 in the array 222 is connected to and serviced by the digital processing board 302. In embodiments using a plurality of digital processing boards 302, each of the digital processing boards is connected to and services a subset of the total number of radiating elements 316 in the array 222. The subsystem 112 may be configured such that each of the plurality of digital processing boards 302 is communicatively connected to and services the same (or approximately the same) number of radiating elements 316. The number of digital processing boards 302 in the subsystem 112 may be determined based on the number of input and output ports available on the digital processing board 302 (which would limit the number of radiating elements 316 that can be connected to the board 302).

Each digital processing board 302 may have a "prime" digital processing board and a "redundant" digital processing board (which is, in effect, a duplicate of the prime).

Digital boards 302 may be distributed as tiles with each board configured to service a subset of the radiating elements 316 (receive and transmit). This configuration of digital processing boards 302 may advantageously simplify beamforming complexity of the array and interconnectivity within the array.

The digital processing board 302 includes an integrated circuit 304. In an embodiment, the integrated circuit 304 is a field programmable gate array ("FPGA"). The integrated circuit 304 includes an Rx digital beamforming network 306 and a Tx digital beamforming network 308. The digital beamforming networks 306, 308 perform digital beamforming operations for Rx and Tx operations, respectively.

The digital processing board 302 also includes a plurality of input connections and output connections 310. The inputs/outputs 320\4 facilitate communication between the digital processing board 302 and the radiating modules 312. In particular, the inputs/outputs 324 include an output connection for routing an output of the Tx beamforming network 308 to the signal amplification module 320 of the radiating module 312 and an input connection for receiving an amplified Rx signal from the signal amplification module 320 and routing the Rx signal to the Rx digital beamforming network 306 for signal processing.

In some cases, the digital processing board 302 may receive beamforming information (e.g. partial beamforming information) from or provide beamforming information to another digital processing board 302 in the subsystem 112. The OBP 214 may thus be configured to perform distributed digital beamforming using multiple digital processing boards 302.

The radiating array subsystem 112 also includes a thermal plate 326. The thermal plate 326 is disposed between the signal amplification modules 320 of the radiating array 222 and the digital processing boards 302 of the OBP 214. The thermal plate 326 is adapted to passively transfer heat generated by heat generating components of the array subsystem 112 (e.g. integrated circuits 304, signal amplification modules 320) away from the center of the array 222 and towards the sides. For example, the signal amplification modules 320 and digital processing boards 302 may be mounted to opposing sides of the thermal plate 326.

In an embodiment, the thermal plate 326 includes a panel of material having good thermal conductivity and a plurality of oscillating heat pipes embedded in the panel. The thermal plate 326 includes a surface onto which spacecraft heat pipes can be mounted to provide a thermal interface for heat exchange from the thermal plate 326 to the spacecraft heat pipes.

Figure 4A:
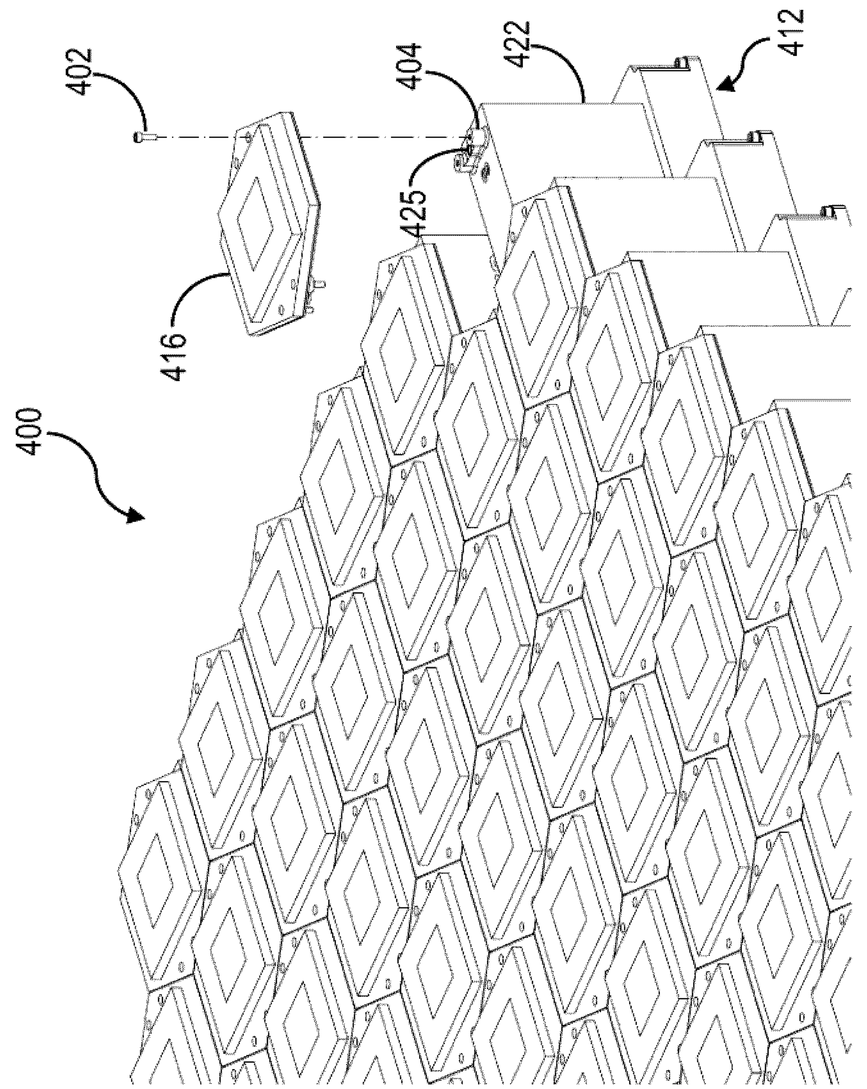
FIG. 4A is a perspective view of a dual band radiating array, according to an embodiment.

Now referring to FIG. 4A, shown therein is a dual band radiating array 400, according to an embodiment. The dual band radiating array 400 may be the dual band radiating array 222 shown in FIGS. 2-3.

The dual band array 400 includes a plurality of radiating modules 412. Each radiating module 412 is modular having a dual band radiating element 416 and a combined unit 422. Advantageously, the modularity of the radiating modules 412 in the array 400 allows for individual radiating modules 412 (or individual radiating elements 416 and/or combined units 422) to be installed/repaired/replaced easily with minimal impact to the rest of the array 400.

Each dual band radiating element 416 is attached to a combined unit 422 by mechanical fasteners 402 that are received at complimentary mounting points 404 on the combined unit 422. Similarly, each combined unit 422 is individually attached to a substrate surface on which the array 400 is formed. The mechanical fastener 402 may be a screw and the mounting point 404 may be a threaded aperture. The fastener 402 and the mounting point 404 are preferably constructed of metal for a secure attachment and flush contact between the radiating element 416 and the combined unit 422.

Figure 4C:
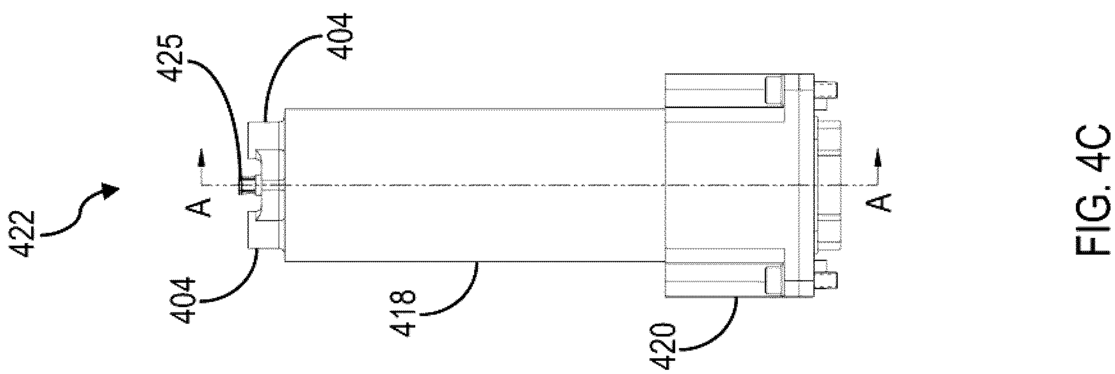
FIG. 4C is a side view of the combined unit of FIG. 4A.
Figure 4B:
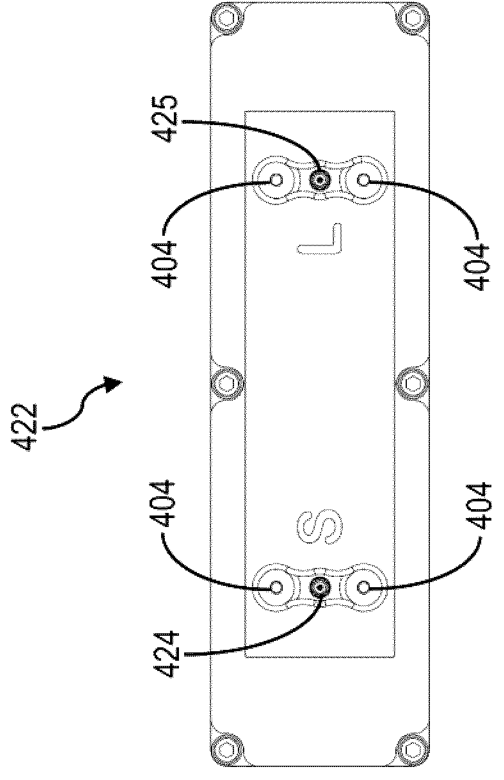
FIG. 4B is a top view of the combined unit of FIG. 4A.
Figure 4D:
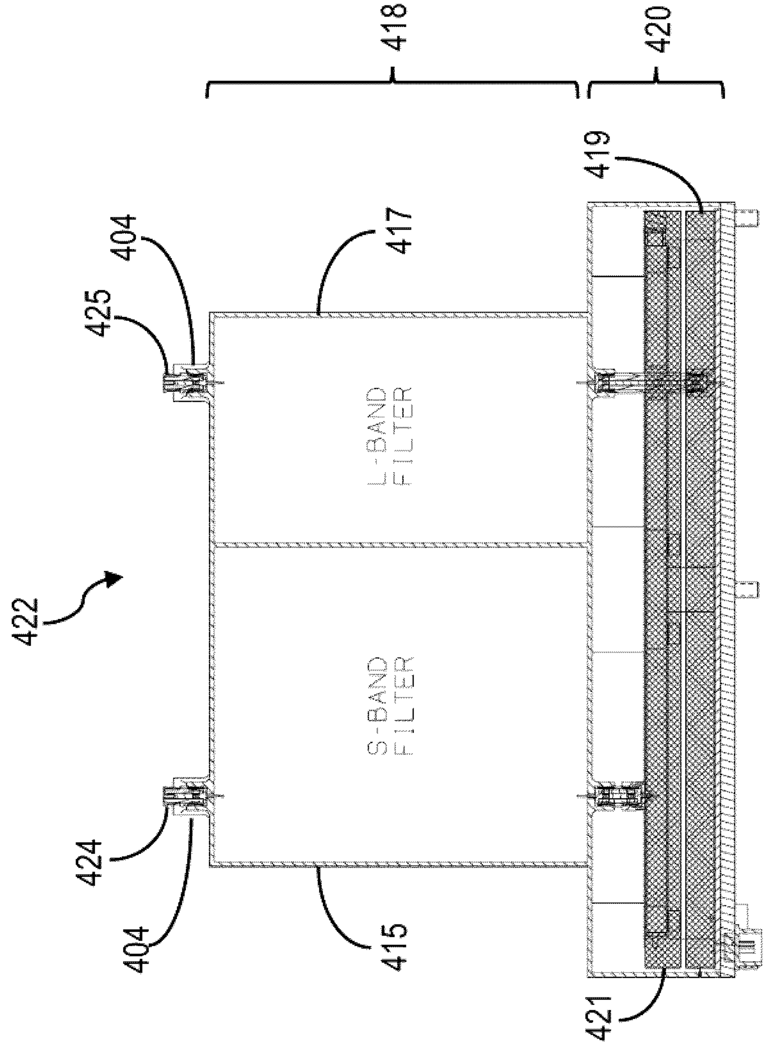
FIG. 4D is a sectional view through section A-A in FIG. 4C.

Referring to FIGS. 4B-4D, shown therein are top, side and sectional views, respectively of the combined unit 422, according to an embodiment. The combined unit 422 includes a filtering module 418 for filtering RF signals, and a signal amplification module 420 for performing signal amplification on RF signals.

The filtering module 418 includes a receive filter unit 417 and a transmit filter unit 415 for filtering Rx and Tx signals, respectively. The signal amplification module 420 includes an Rx signal amplification unit 421 (e.g. low noise amplifier or "LNA") and a Tx signal amplification unit 419 (e.g. solid-state power amplifier or "SSPA") for performing signal amplification on Rx and Tx signals, respectively.

The combined unit 422 includes a Tx signal interface 424 and a Rx signal interface 425 for relaying RF signals from the filter unit 418 the radiating element 416. The signal interfaces 424, 425 contact I/O connectors on the radiating element 416 when the radiating element 416 is attached to the combined unit 422 to form a radiating module 412.

Figures 5A, 5B:
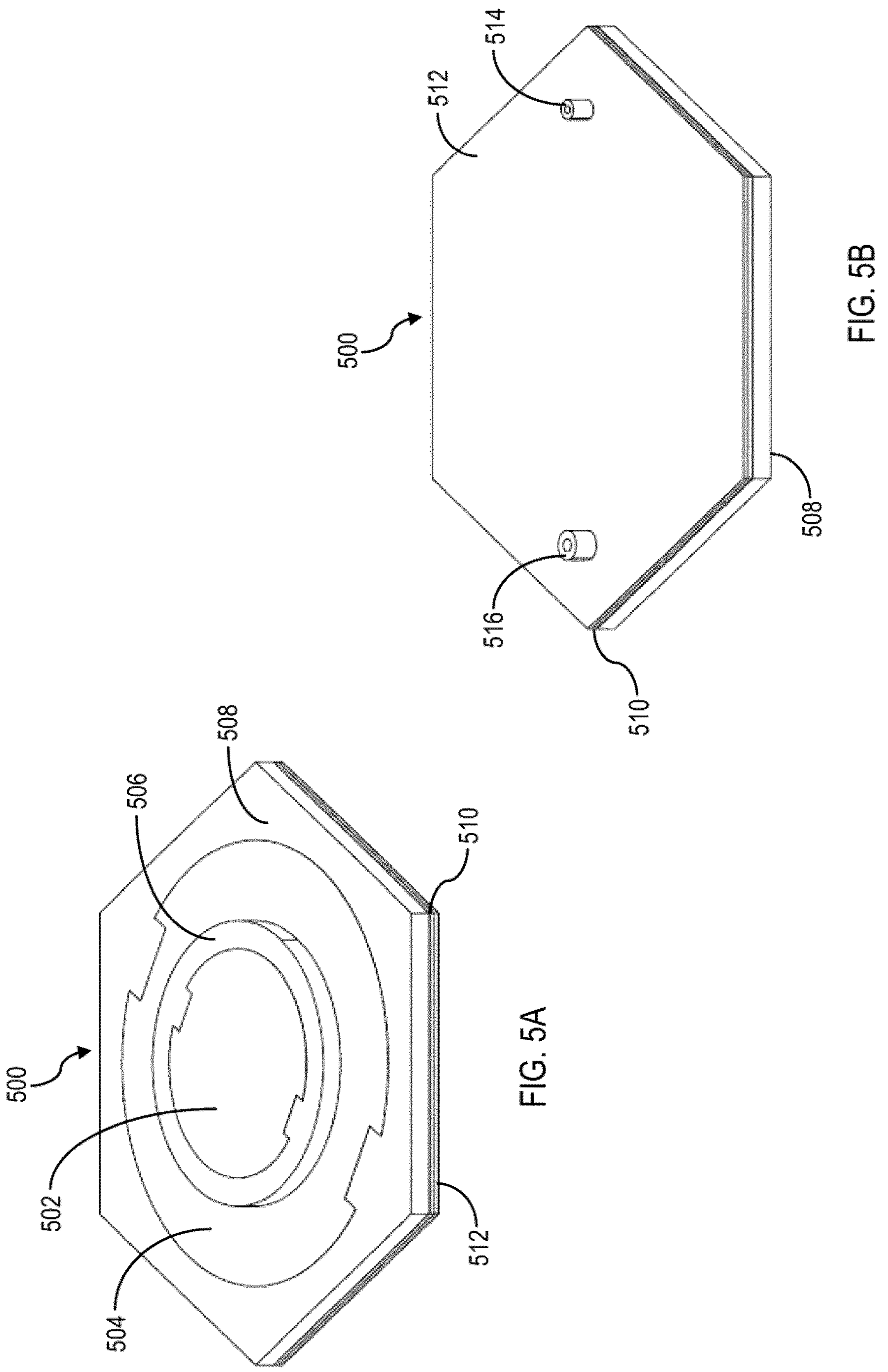
FIG. 5A is a top perspective view of a dual band radiating element, according to an embodiment.
FIG. 5B is a bottom perspective view of the band radiating element of FIG. 5A.
Figure 5C:
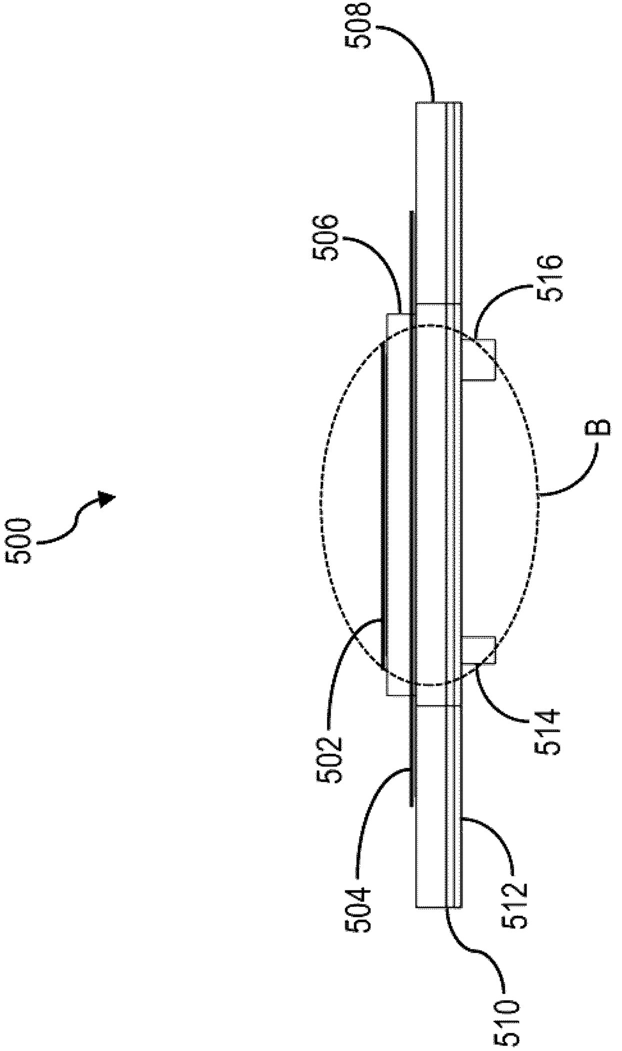
FIG. 5C is a side plan view of the dual band radiating element of FIG. 5A.

Referring now to FIGS. 5A-5C, shown therein are top, bottom, and side plan views, respectively, of a dual band radiating element 500, according to an embodiment. The radiating element 500 is a basic subunit of a dual band radiating array (e.g. array 222 in FIGS. 2-3, array 400 in FIG. 4). The radiating element 500 is a dual band radiating element capable of transmitting an RF signal of a first frequency band and receiving an RF signal of a second frequency band.

The radiating element 500 includes a first radiating patch 502 and a second radiating patch 504. The first radiating patch 502 is configured to transmit an RF signal of a first signal frequency band (e.g. S-band). The second radiating patch 504 is configured to receive an RF signal of a second signal frequency band (e.g. L-band). The first radiating patch 502 and the second radiating patch 504 may be constructed of suitable metals. As shown, the first radiating patch 502 and the second radiating patch 504 are substantially circular. According to other embodiments, the first radiating patch 502 and the second radiating patch 504 may be shaped differently.

The first and second radiating patches are arranged in a stacked patch configuration, wherein one radiating patch (e.g. first radiating patch 502) is disposed on top of the other radiating patch (e.g. second radiating patch 504), whereby the second radiating patch 504 may be used as the ground plane for the first radiating patch 502. The radiating element 500 may be a dual band self-circular polarization radiating element, wherein the electromagnetic wave generated by the radiating element 500 is circularly polarized. The self-circular polarization may be achieved by use of a feed network (described below) or a self-circular polarization radiating patch. The use of a feed network will generally improve the axial ratio (quality of the circularly polarized signal) of the radiating element 500 compared to use of a self-circular polarization patch alone.

The radiating element 500 includes a first dielectric layer 506 interposed between the first radiating patch 502 and the second radiating patch 504. A second dielectric layer 508 is interposed between the second radiating patch 504 and a ground plane 510. The first dielectric 504 and the second dielectric may be selected for compatibility with the first radiating patch 502 and the second radiating patch 504, respectively. The ground plane 510 may be constructed of any suitable metal.

The radiating element 500 includes a base plate 512, preferably constructed of aluminum. The base plate 512 includes a transmit (Tx) connector 514 and a receive (Rx) connector 516. The Tx connector 514 and Rx connector 516 connect may be general purpose I/O connectors used to route signals to/from the radiating element 500. For example, the Tx connector 514 may route a transmit signal to the first radiating patch 502 and the Rx connector 516 may route a received signal from the second radiating patch 504.

Compared to conventional stacked patch antennas, the radiating element 500 provides a weight-relieved design that requires less material due to the concentric arrangement (seen in FIGS. 5A, 5C) of the first radiating patch 502, the first dielectric layer 506, the second radiating patch 504 and the second dielectric layer 508. For example, the first radiating patch 502 is centered on the first dielectric layer 506, rather than covering the entirely of the first dielectric layer 506. Similarly, the first dielectric layer 506 itself is centered on the second radiating patch 504 rather than covering the entirety of the second radiating patch 504. This arrangement can realize up to 40%-50% reduction in materials and weight when compared to conventional stacked patch systems wherein one patch entirely covers the other.

Figure 5D:
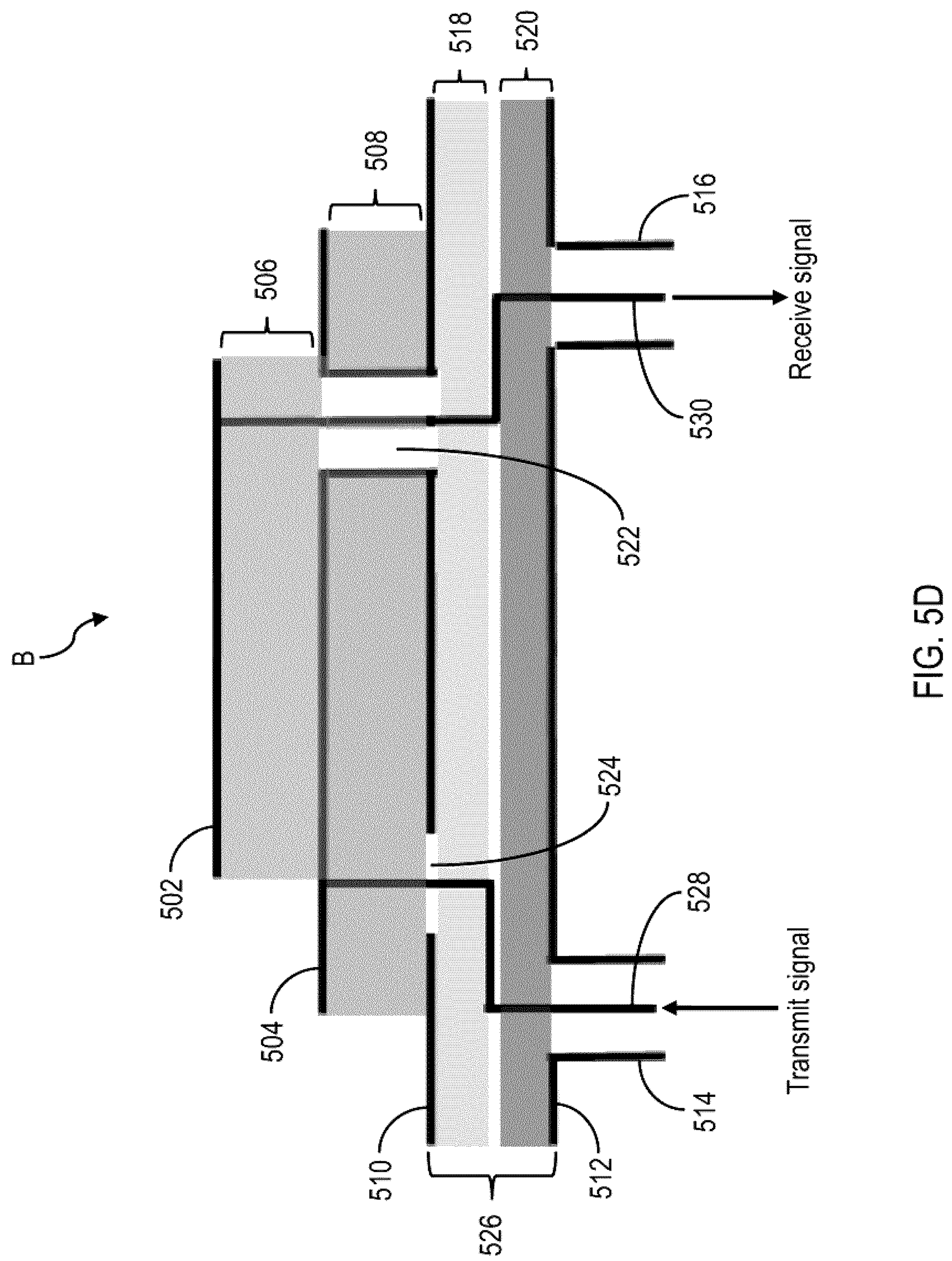
FIG. 5D is a magnified view of region B in FIG. 5C.

Turning to FIG. 5D, shown therein is a magnified sectional view of region B in FIG. 5C (for ease of illustration, the magnification of all components is not to scale). Transmit signals are routed via feed pin 528 from the Tx connector 514 to the second radiating patch 504 passing through port 524. Receive signals are routed via feed pin 530 from the first radiating patch 502 to the Rx connector through port 522.

The ground plane 510 and base plate 512 between them enclose a strip line feed network 526. The strip line feed network 526 includes dielectric feed layers 518, 520 constructed of the same material. The position of the connectors 514, 516 on the base plate 512 can vary depending on the position of the radiating element 500 within the array, thus the feed network 526 is used to route the feed pins 528, 530 from the connectors 514, 516 through the ports 522, 524. This makes it easy to implement sequential rotation of the radiating elements 500 while maintaining the same mechanical interface with the combined unit (i.e. mounting points 404 on combined unit 422 in FIGS. 4A-4D). Sequential rotation is a known technique of laying out an antenna array that can improve cross-polarization performance by destructively combining the cross-polarization patterns between individual radiating elements 500 in the array by physically rotating the radiating element and adjusting signal phase accordingly.

A challenge in stacked dual band antennas is that the isolation of the receive band port 524 from the transmit band port 522 is not sufficient for proper operation. Thus, to improve isolation of the first radiating patch 502, the feed pin 530 is shielded as it passes through port 522 in the second dielectric layer 508.

Figure 6A:
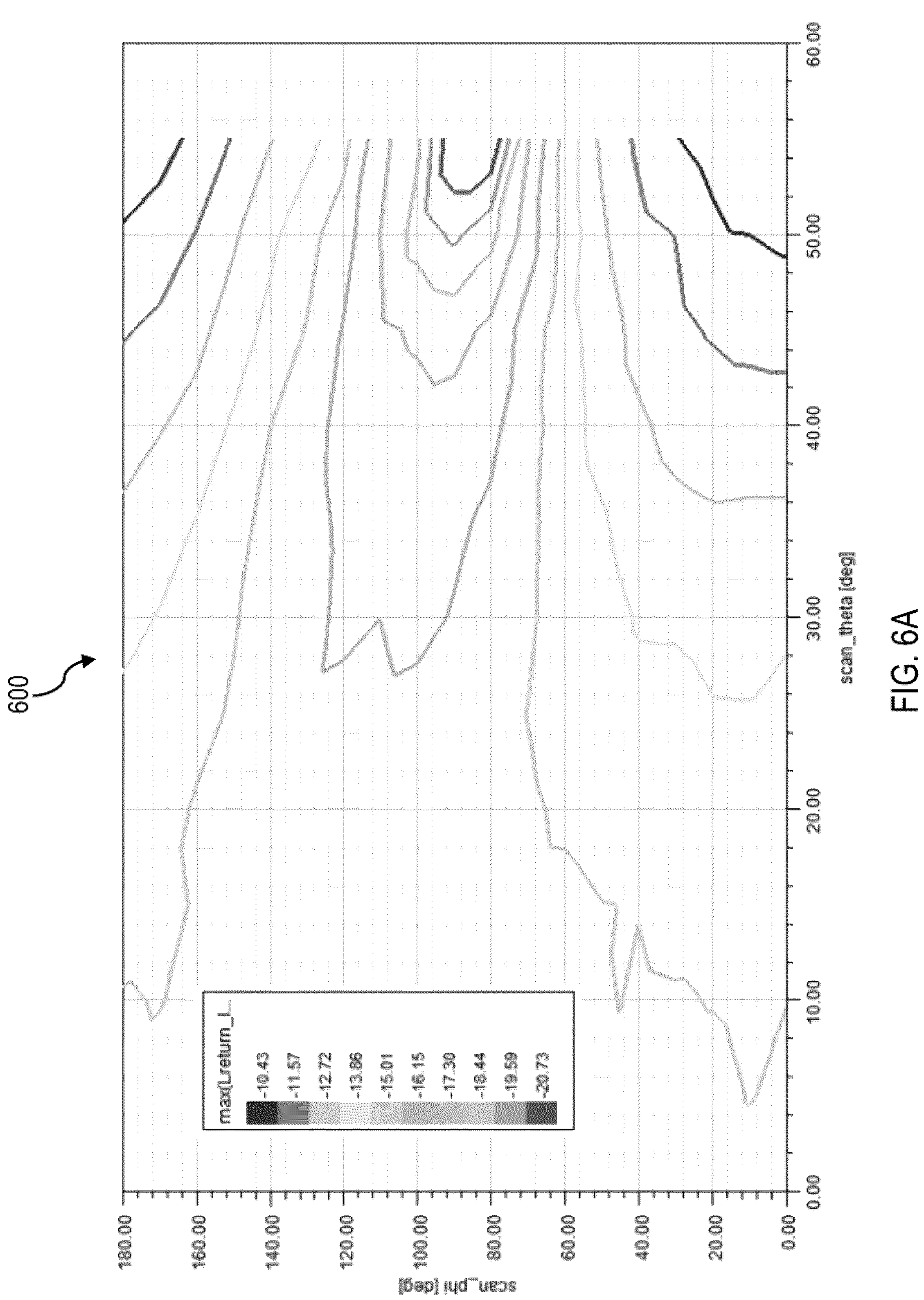
FIG. 6A is an exemplary plot of L-Band return loss of the dual band radiating element in FIGS. 5A-5D.
Figure 6B:
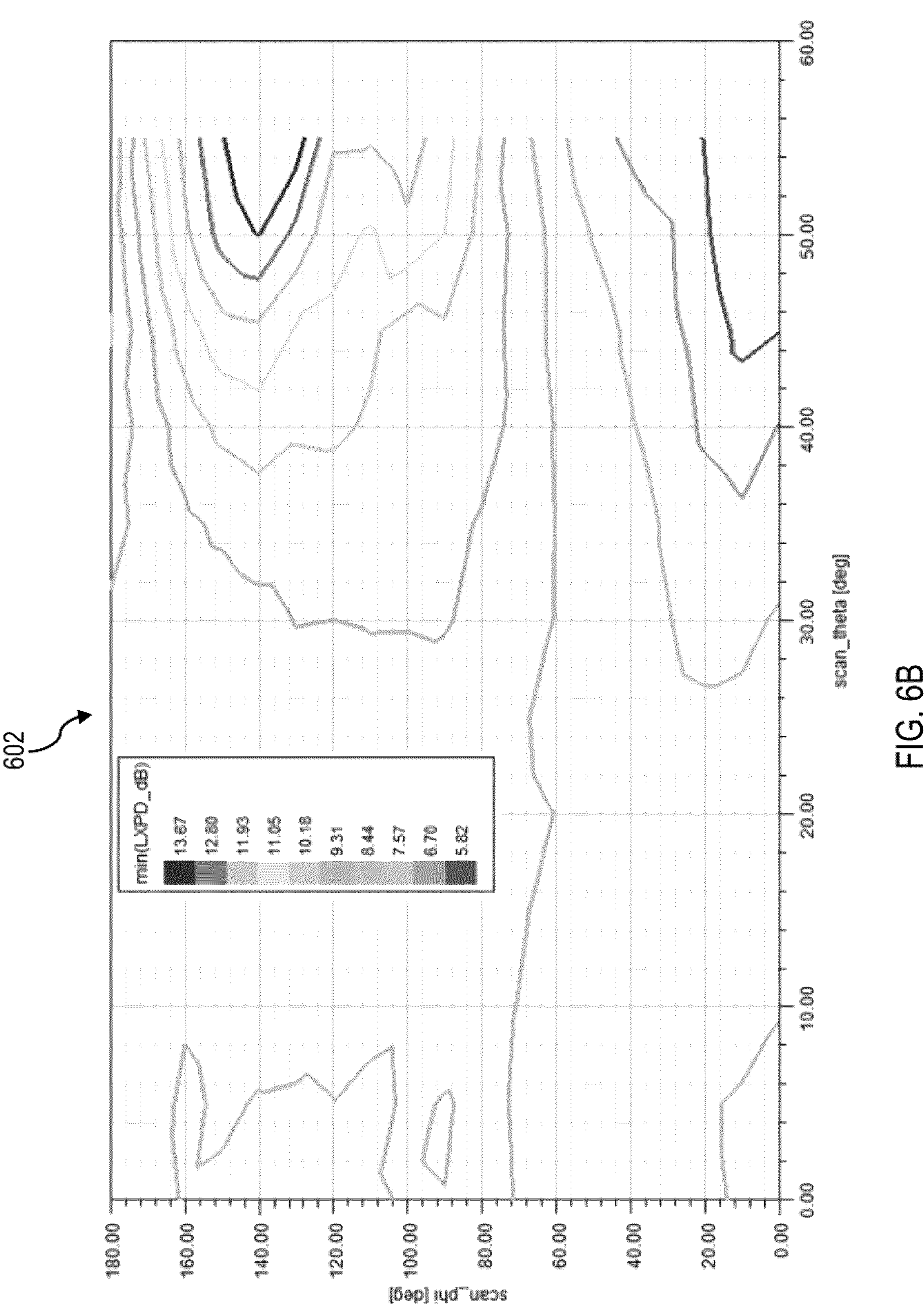
FIG. 6B is an exemplary plot of L-Band cross polar discrimination of the dual band radiating element in FIGS. 5A-5D.

Referring to FIGS. 6A-6B, shown therein are plots of L-Band return loss 600 and L-Band cross polar discrimination (XPD) 602, respectively. Return loss and XPD are metrics for assessing the scanned performance of a radiating array. FIGS. 6A-6B are exemplary of the scanning performance of an array (e.g. array 222 in FIGS. 2-3, array 400 in FIG. 4) comprising radiating elements including an L-band radiating patch (e.g. radiating element 500 in FIGS. 5A-5D).

Figure 7A:
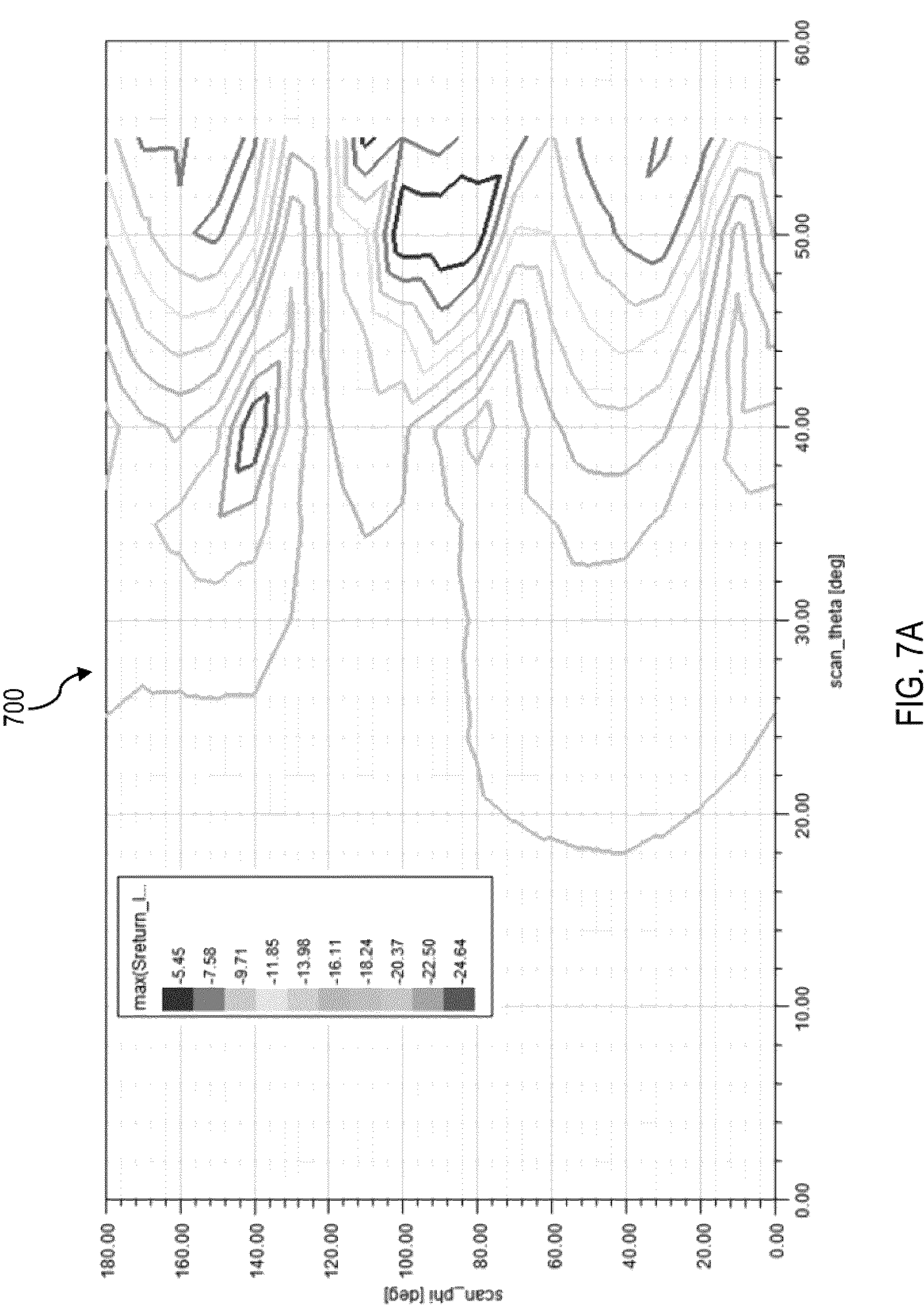
FIG. 7A is an exemplary plot of S-Band return loss of the dual band radiating element in FIGS. 5A-5D.
Figure 7B:
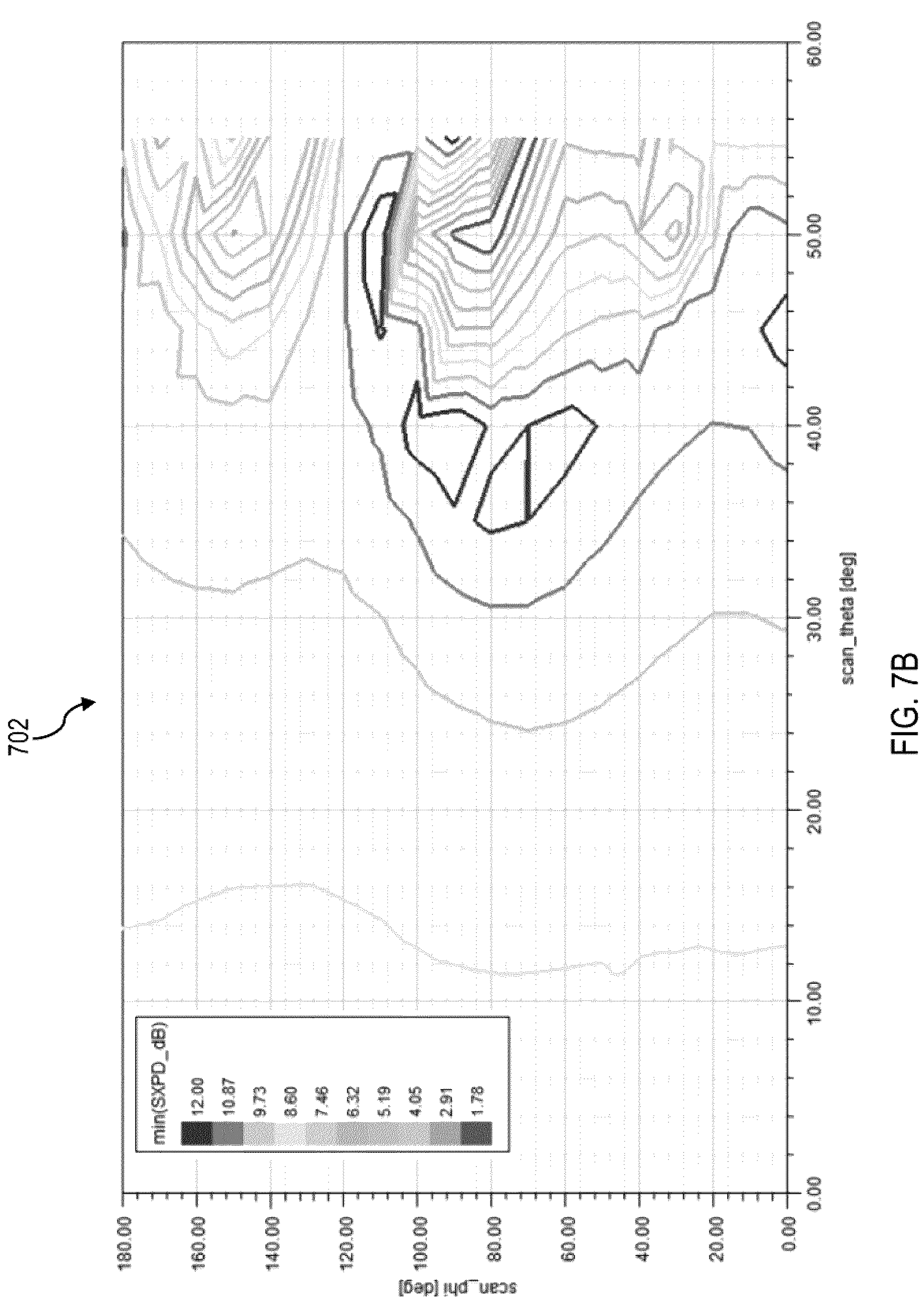
FIG. 7B is an exemplary plot of S-Band cross polar discrimination of the dual band radiating element in FIGS. 5A-5D.

Referring to FIGS. 7A-7B, shown therein are plots of S-Band return loss 700 and L-Band cross polar discrimination (XPD) 702, respectively. FIGS. 7A-7B are exemplary of the scanning performance of an array (e.g. array 222 in FIGS. 2-3, array 400 in FIG. 4) comprising radiating elements including an S-band radiating patch (e.g. radiating element 500 in FIGS. 5A-5D).

Referring again to FIG. 5D, port 522 is a coaxial waveguide through which the feed pin 530 used to feed the first radiating patch 502 passes through the second dielectric later 508. The shielding of the feed pin 530 by the coaxial waveguide port 522 as the feed pin 530 passes through the second dielectric layer 508 isolates the first radiating patch 502 from the second radiating patch 504 to enable the scanned performance of the radiating array 500 as exemplified in FIGS. 6A-6B and 7A-7B. Consequently, coupling between the S-Band and L-Band are avoided and the specification (bandpass) of the filtering modules (e.g. filtering module 418, receive filter unit 417 and transmit filter unit 415 in FIGS. 4C-4D) can be less stringent.

While the above description provides examples of one or more apparatus, methods, or systems, it will be appreciated that other apparatus, methods, or systems may be within the scope of the claims as interpreted by one of skill in the art.

The invention claimed is:

1. A dual band radiating element configured for removable installation in a radiating array, the dual band radiating element comprising:

a first radiating patch and a second radiating patch;

a first dielectric layer interposing the first radiating patch and the second radiating patch, the first dielectric layer selected for compatibility with the first radiating patch;

a second dielectric layer interposing the second radiating patch and a single ground plane, the second dielectric layer selected for compatibility with the second radiating patch, the first and second dielectric layers being separate;

a single base plate, comprising:

a top surface adjacent to the ground plane; and a bottom surface having a first connector and a second connector disposed thereon without intervening dielectric substrate between the bottom surface and the first and second connectors, wherein the connectors are disposed on the base plate at locations corresponding to an array position of the dual band radiating element within the radiating array;

a first feed pin for relaying radio frequency signals from the first connector to the second radiating patch via a first port in the second dielectric layer;

a second feed pin for relaying radio frequency signals from the second connector to the first radiation patch via a second port in the second dielectric layer;

a single feed network for routing the first feed pin and the second feed pin to the first port and the second port, respectively, wherein the top surface of the base plate and the ground plane enclose the single feed network; and at least one aperture configured to receive a mechanical fastener to removably attach the dual band radiating element to the radiating array at the array position.

2. The radiating element of claim 1, wherein the second pin is shielded by the second port as the second pin passes through the second dielectric layer, to isolate the first radiating patch from the second radiating patch.

3. The radiating element of claim 2, wherein the second port is a coaxial waveguide.

4. The radiating element of claim 1, wherein the feed network comprises:

a third dielectric layer and a fourth dielectric layer.

5. The radiating element of claim 4, wherein the third dielectric layer and the fourth dielectric layer are constructed of the same material.

6. The radiating element of claim 1, wherein the first radiating patch, the first dielectric layer, the second radiating patch and the second dielectric layer form concentric layers.

7. The radiating element of claim 6, wherein the first radiating patch is centered on the second radiating patch and covers about 50% of the surface area of second radiating patch.

8. The radiating element of claim 7, wherein the first radiating patch and the second radiating patch are substantially circular.

9. The radiating element of claim 6, wherein the first dielectric layer is centered on the second dielectric layer.

10. The radiating element of claim 1, wherein the first radiating patch is configured to transmit an RF signal of a first frequency band and the second radiating patch is configured to receive an RF signal of a second frequency band.

11. The radiating element of claim 1, wherein the base plate is constructed of aluminum.

* * * * *